(12) United States Patent
Yau

(10) Patent No.: US 6,773,959 B2
(45) Date of Patent: Aug. 10, 2004

(54) METHOD FOR STACKING SEMICONDUCTOR PACKAGE UNITS AND STACKED PACKAGE

(75) Inventor: Chad Yau, Saratoga, CA (US)

(73) Assignee: Sampson Taiwan Ltd. (TW)

( * ) Notice: Subject to any disclaimer, the term of this patent is extended or adjusted under 35 U.S.C. 154(b) by 0 days.

(21) Appl. No.: 10/087,414

(22) Filed: Mar. 1, 2002

(65) Prior Publication Data

US 2003/0164539 A1 Sep. 4, 2003

(51) Int. Cl.⁷ .............................................. H01L 21/44

(52) U.S. Cl. ...................... 438/109; 257/723; 257/686; 257/777

(58) Field of Search .......................... 438/109; 257/723, 257/686, 777

(56) References Cited

U.S. PATENT DOCUMENTS 6,242,285 B1 * 6/2001 Kang ........................ 438/109

* cited by examiner

Primary Examiner—Luan Thai
(74) Attorney, Agent, or Firm—Dorsey & Whitney LLP; Edward N. Bachand

(57) ABSTRACT

A stacked package of semiconductor packaging units includes a direct electrical connection between leads of an upper semiconductor package unit, and includes direct electrical connections between selected leads of the upper semiconductor package unit and a lower semiconductor package unit. Leads of the upper semiconductor package unit are straightened, and chip-select and clock-enable leads are shortened and electrically connected to adjacent not-connected leads. Selected leads of the upper semiconductor package unit are electrically connected directly to underlying leads of the lower semiconductor packaging unit. Electrical connections preferably are solder connections.

8 Claims, 4 Drawing Sheets

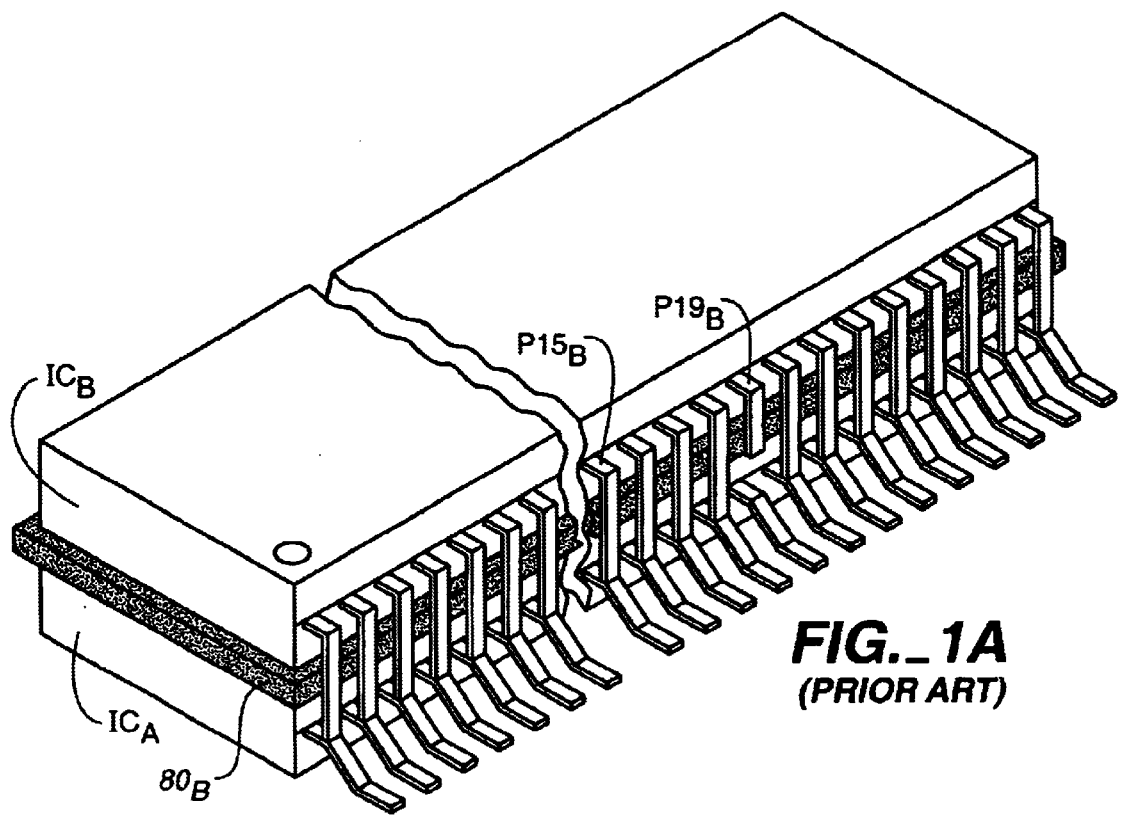
FIG._1A
*(PRIOR ART)*
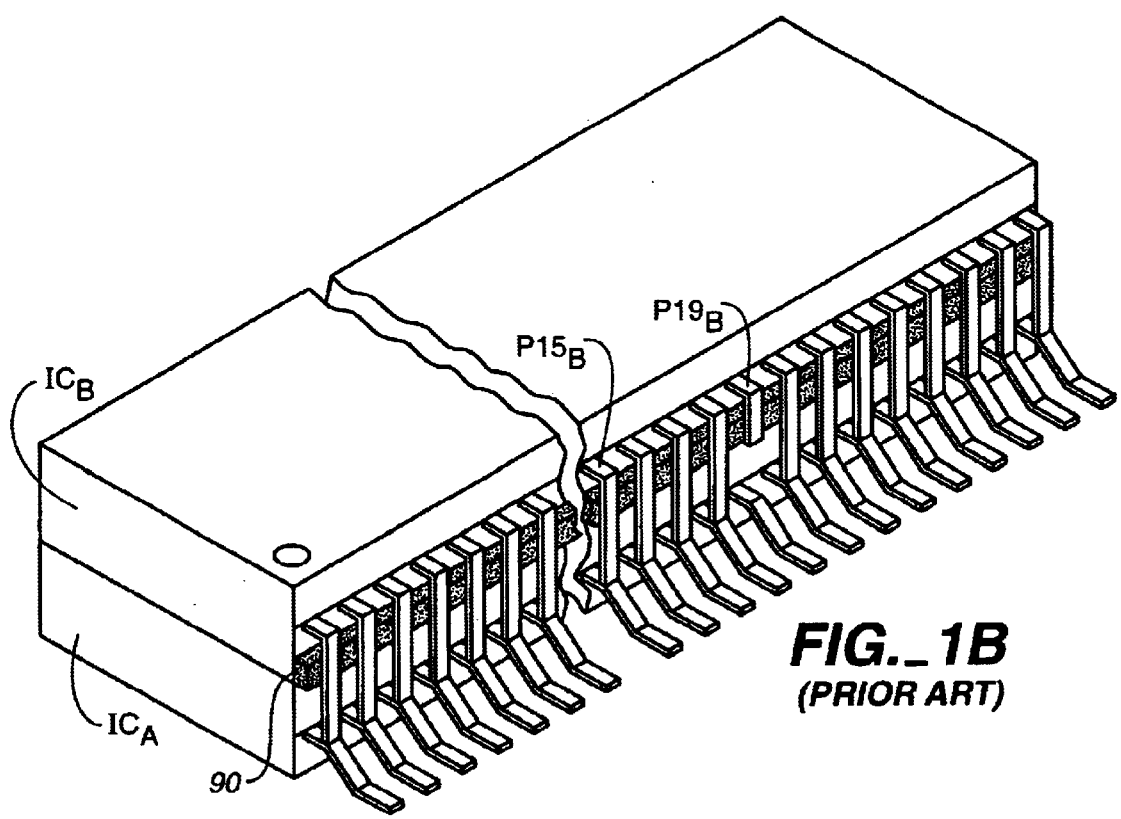
FIG._1B
*(PRIOR ART)*

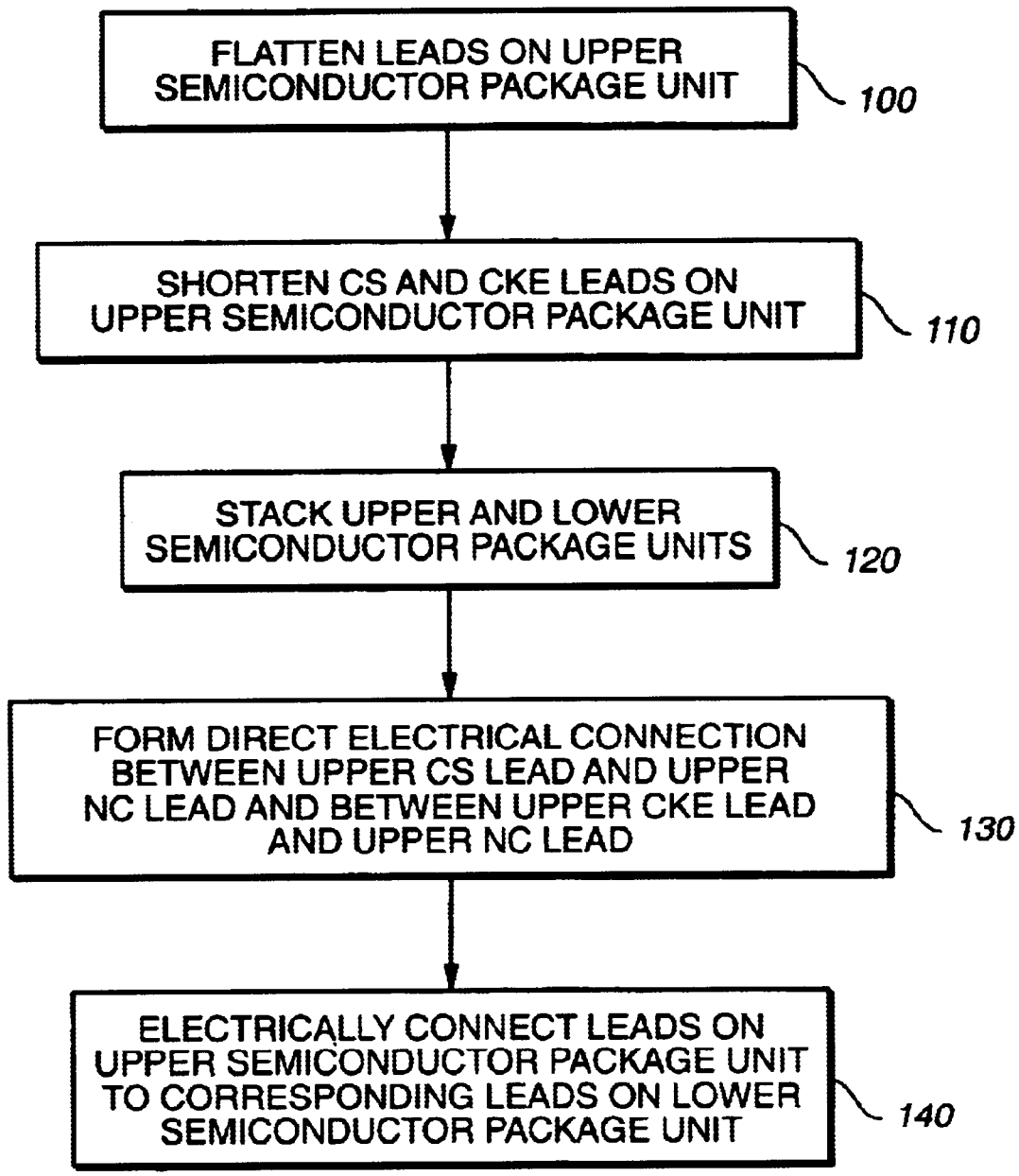
FIG._2

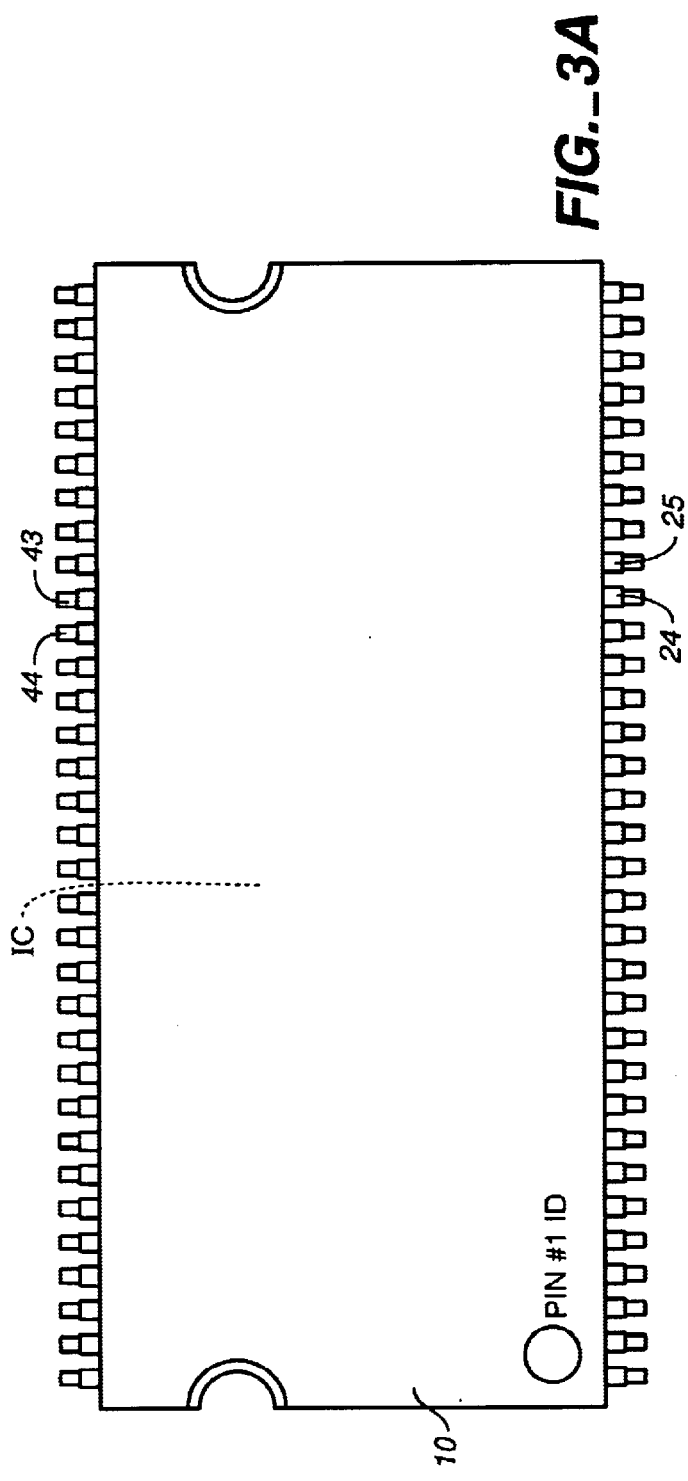
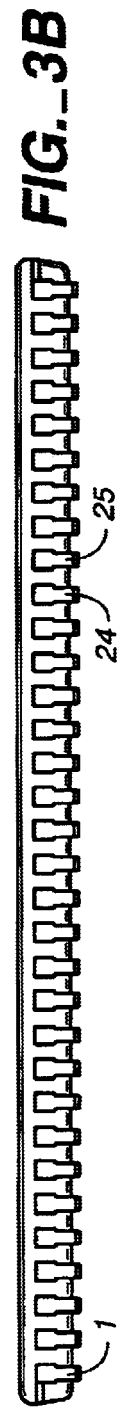
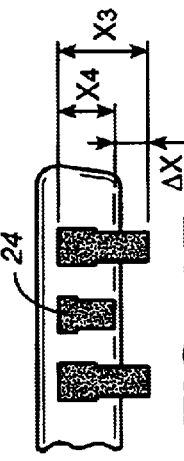
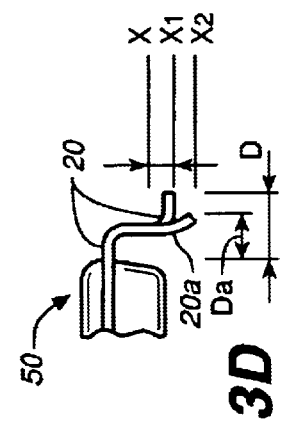
FIG._3A
FIG._3B
FIG._3C
FIG._3D
FIG._3E

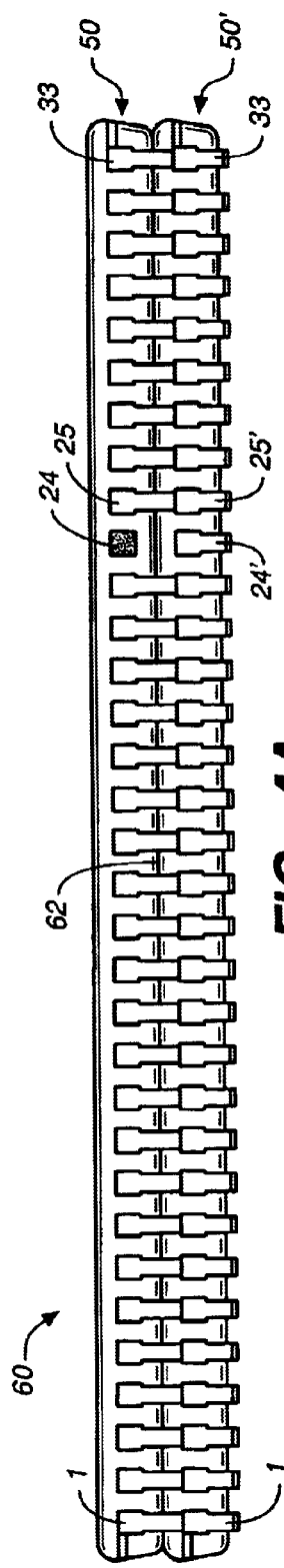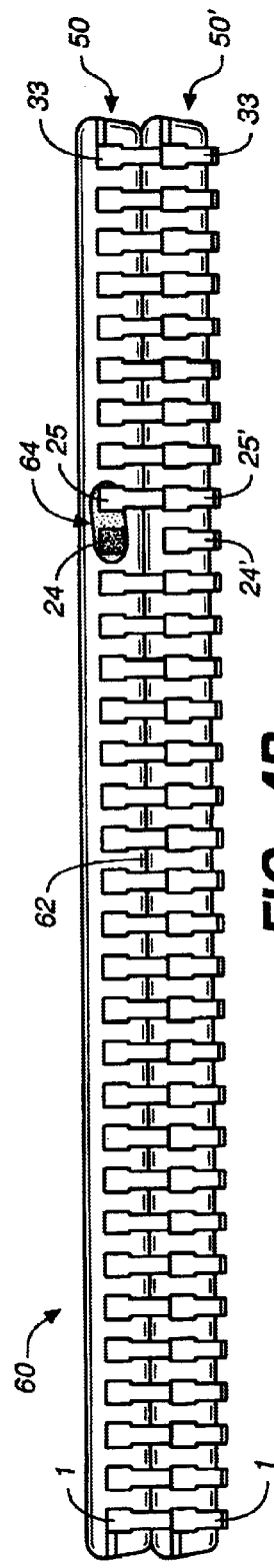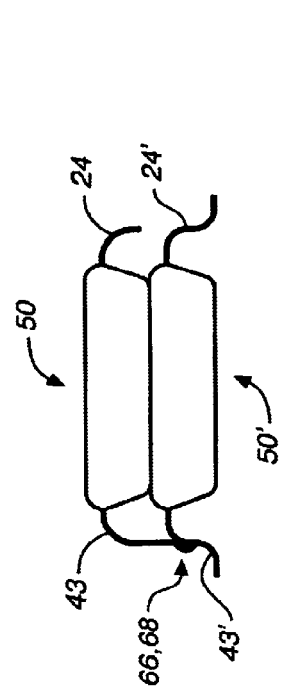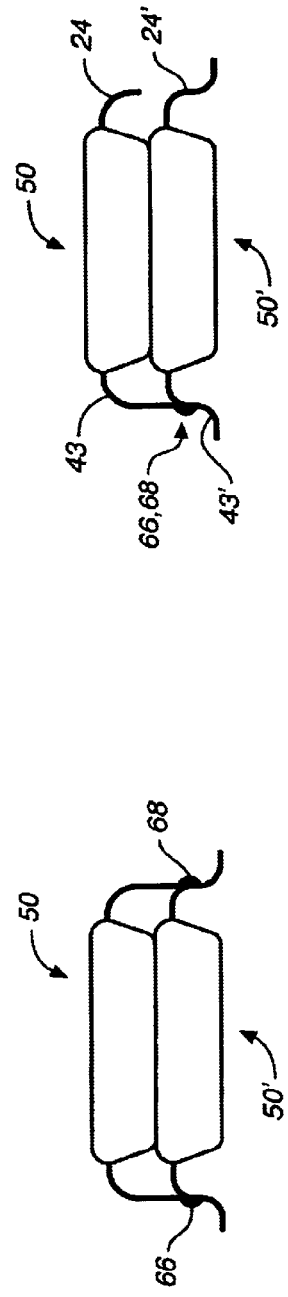

METHOD FOR STACKING SEMICONDUCTOR PACKAGE UNITS AND STACKED PACKAGE

FIELD OF THE INVENTION

The invention pertains generally to stacking semiconductor package units to form a space-saving stacked package; and more particularly, to forming a stacked package without using a complex inter-unit structure.

BACKGROUND OF THE INVENTION

Many present electronic products comprise a number of semiconductor package units surface mounted on a printed circuit board (PCB) and connected together to form an overall circuit. A semiconductor package unit comprises an integrated circuit (IC) chip encased in a package comprising an insulating material (ceramic, plastic or the like) having a set of protruding leads. Bonding pads on the integrated circuit chip are electrically connected with bond wires to leads of the package. Other leads of the package may not be connected (NC) to the internal integrated circuit chip. External connections are made to the internal chip via the package's leads.

As electronic products continue to shrink in size, it is desirable to increase the number of components mounted on a unit area of PCB. One way to accomplish this is to provide a stacked semiconductor package that integrates semiconductor package units into a stacked unit having a footprint similar to one semiconductor package unit. Forming a stacked semiconductor package presents at least two problems: forming connections between leads of an upper semiconductor package and a lower semiconductor package; and retaining the ability to access, or select, each semiconductor package unit individually.

Some prior art methods such as that of Wakefield, et al. (U.S. Pat. No. 5,512,783) stack semiconductor package units having rotationally symmetrical lead layouts by placing a first semiconductor package unit upside-down on top of a second semiconductor package unit. Direct solder connections are then formed between selected leads of the upper and lower semiconductor package units. Understandably such an approach does not lend itself to stacking semiconductor package units in which each unit has the same orientation.

While such prior art techniques can avoid use of complicated intra-unit structures, the ability to select each semiconductor package unit independently is typically accomplished with an auxiliary inter-unit structure. In operation, a semiconductor package unit is accessed, or selected, by applying a signal to a chip-select (CS) lead. A semiconductor package unit may have more than one CS lead, each selecting a different functionality of the integrated circuit. When forming direct solder connections between leads of an upper semiconductor package unit and a lower semiconductor package unit, then, it is undesirable to form a direct solder connection between an upper CS lead and a lower CS lead. Doing so would mandate selecting a functionality of the upper unit simultaneously with a functionality of the lower unit. Typically, CS leads of the upper unit are shortened so as to not come in contact with the corresponding lead of the lower unit and the upper CS leads are connected to NC leads of a lower semiconductor package. Signals from external circuitry reaching the lower unit's NC lead will have no effect on the lower IC chip, but will select a functionality of the upper IC chip.

There are other leads for which it may be desirable to access each package's lead separately. One example is a clock enable (CKE) lead. Typically, digital IC chips contain a clock circuit that generates a periodic waveform utilized to time other calculations performed on the IC chip. It may be necessary, then, to enable the clocks of the semiconductor package units separately. Typically, this is accomplished as described for the CS leads above. Namely, CKE leads of the upper unit are shortened so as to not come in contact with the corresponding lead of the lower unit and the upper CKE leads are connected to NC leads of a lower semiconductor package.

In the case where the lead layouts of two semiconductor package units are identical, as shown in FIG. 1A, when the units are stacked, the CS and CKE leads of the upper unit are connected to NC leads of the upper unit, which can then be directly soldered to NC leads of the lower unit. FIG. 1A shows two semiconductor package units $IC_A$ and $IC_B$. In this figure, leads $19_A$ and $19_B$ are CS leads and leads $15_A$ and $15_B$ are NC leads. The step of connecting CS lead $19_B$ of the upper unit to NC lead $15_B$ of the upper unit is conventionally accomplished by use of an auxiliary connector unit, such as shown in Kang (U.S. Pat. No. 6,242,285). An exemplary auxiliary unit may be a PCB board $80_B$ with a wire placed to connect the leads, or, as shown in FIG. 1B, a piece of auxiliary material 90 placed between the plastic or ceramic package and the leads, containing a wire to connect the desired two leads. These auxiliary connector units add to the cost of the overall assembly. Further, such units can become unnecessarily complex and their use becomes more challenging as the distance between leads decreases.

Thus, there is a need for a stacked package of semiconductor package units having direct connections between leads of the upper and lower package units that requires no auxiliary connection unit between leads of the upper package.

The present invention provides such a package and a method for forming the package.

SUMMARY OF THE INVENTION

The present invention provides a stacked semiconductor package comprising at least an upper semiconductor package and a lower semiconductor package. Selected leads of the upper semiconductor package are preferably directly soldered to corresponding leads of the lower semiconductor package unit. Each semiconductor package unit can be independently selected, and each clock circuit in each semiconductor package unit can be independently enabled. A chip select (CS) lead of the upper semiconductor package unit is shortened, and a direct connection is provided between the shortened upper CS lead and a first upper not-connected (NC) lead, also on the upper semiconductor package unit. The first NC lead may then be directly connected to a lower NC lead directly beneath the upper NC lead. An analogous process is performed for a clock enable (CKE) lead of the upper semiconductor package unit. Advantageously the resultant structure does not require an auxiliary connector unit.

Other features and advantages of the invention will appear from the following description in which the preferred embodiments have been set forth in detail, in conjunction with the accompanying drawings.

BRIEF DESCRIPTION OF THE DRAWINGS

FIGS. 1A and 1B are perspective views showing use of an auxiliary connector unit to interconnect two leads of an upper semiconductor package unit interconnected, according to the prior art;

FIG. 2 depicts method steps used to form a stacked semiconductor package, according to the present invention;

FIGS. 3A AND 3B are plane and side view of an exemplary semiconductor package unit, according to the present invention;

FIG. 3C is an end view of a portion of the package unit shown in FIGS. 3A and 3B, according to the present invention;

FIG. 3D depicts a straightened lead of the semiconductor package unit shown in FIG. 3C, according to the present invention;

FIG. 3E depicts a shortened lead of a semiconductor package unit, according to the present invention;

FIG. 4A is a side view of first and second semiconductor package units, stacked for assembly, according to the present invention;

FIG. 4B is a left side view of the assembly of FIG. 4A, depicting a direct connection between two leads of the upper semiconductor package unit, according to the present invention;

FIG. 4C is a right side view of the assembly of FIG. 4A, depicting a direct connection between two leads of the upper semiconductor package unit, according to the present invention; and FIGS. 5A and 5B depict presence and absence of direct electrical connections between selected corresponding leads of upper and lower semiconductor package units of FIG. 4A, according to the present invention.

DETAILED DESCRIPTION OF THE PREFERRED EMBODIMENTS

An overview of a method to stack semiconductor package units according to the present invention is given in FIG. 2. For ease of description, an overall package comprising two semiconductor package units will be described, where the upper unit has a CS lead and a CKE lead. However, it will be appreciated that more than two semiconductor package units could be stacked, according to the present invention. Furthermore, the present invention is applicable to upper semiconductor units having any number of leads to be accessed independently of the corresponding lead of the lower semiconductor package unit.

Referring to FIG. 2, the leads of an upper semiconductor package unit are flattened at step 100, and CS and CKE leads on the upper semiconductor package unit are shortened at step 110. Flattening and shortening procedures may be carried out in a variety of ways, including using of a jig and fixture. For example, a side-ways approaching blade may be used to shortening desired leads against an anvil-like jig arrangement.

An upper and lower package are stacked in the same orientation at step 120. Such stacking may be carried out in a variety of ways, including using an auto-dispenser and alignment fixture.

At step 130, direct electrical connections are formed between an upper CS or CKE lead and an adjacent upper NC lead. Such connections preferably are solder connections. Selected leads of the upper semiconductor package are preferably soldered directly to selected leads of the lower semiconductor package at step 140. Soldering may be carried out in a variety of ways, including using a soldering jig. Note that CS and CKE leads of the upper semiconductor package unit are preferably not selected for direct solder connections with the lower unit. It will be appreciated from FIG. 2 that the stacked units preferably have the same (e.g., not mirrored) orientation, and that connector unit(s) are not required, in contrast to many prior art approaches for stacking semiconductor package units.

FIGS. 3A and 3B are plane and side views of a package 10 having 66 leads in a so-called 400 mil TSOP (thin small outline package) configuration. Referring to FIG. 3A, unit 50 comprises a package 10 whose leads include leads 24, 25, 43, and 44. The package typically encapsulates a semiconductor integrated circuit chip (IC), and within the package some leads are connected to bond pads on the semiconductor chip. The internal lead to bond pad connections are not shown in FIGS. 3A and 3B for ease of illustration.

Among the leads of a semiconductor package unit for a digital IC chip will typically be a chip-select (CS) lead and a clock-enable (CKE) lead. Functionally, a CS lead is used to select operations of the IC chip to be performed, and the CKE lead enables the clock for the IC chip. The package units typically include at least one lead that is a non-connected (NC) lead adjacent to a CS or CKE lead. In FIG. 3A, lead 24 is a CS lead, lead 44 is a CKE lead, and leads 25 and 43 are NC leads. Such NC leads are intentionally not connected to the internal IC chip.

FIG. 3C is an end view of a portion of the package shown in FIGS. 3A and 3B and depicts an exemplary lead 20, which lead is representative of the various leads in package unit 50, including leads 24, 25, 43, and 44. As shown in FIG. 3C, exemplary lead 20 extends away from the package and contains two bends, denoted bend 22 and bend 28. As noted by step 100 in FIG. 2, a stacking process according to the present invention straightens or flattens leads of the semiconductor package unit to substantially alter bend 28. FIG. 3D depicts lead 20 both as in FIG. 3C, e.g., before straightening, and, now denoted as lead 20a, after straightening. Whereas the distal tip of lead 20 might have extended a distance D of perhaps 0.8 mm from the edge of package 50, the distal edge of lead 20a extends a distance Da that is perhaps only about 0.6 mm from the package edge. Relative to plane X, lead 20 originally was a distance $X_1$ removed, perhaps about 0.25 mm, whereas after straightening, lead 20 is a greater distance $X_2$ removed, perhaps about 0.54 mm. These dimensions are followed in a preferred embodiment and other dimensions may be used.

At step 110 in FIG. 2, the CS and CKE leads of the upper semiconductor package unit 50 are shortened, so as not to make contact with leads of a lower semiconductor package unit. FIG. 3E shows lead 24 after such shortening. Typically the full length X3 of a non-shortened lead might be on the order of perhaps 1.14 mm, and the reduced length X4 of a shortening lead, e.g., lead 24, might be about 0.75 mm, which is to say the amount of lead cutaway, e.g., dimension ΔX, is about 0.39 mm.

FIG. 4A depicts a stacked package 60 comprising an upper semiconductor package unit 50 and a lower semiconductor package unit 50', each unit having the same orientation. FIG. 4 corresponds to method step 120 shown in FIG. 2.

Semiconductor package unit 50, with shortened CS and CKE leads 24 and 44, is placed above semiconductor package unit 50', having the same positioning of CS, CKE and NC leads as semiconductor package 50. In other words, lead 24', directly below CS lead 24, is also a CS lead. Similarly, lead 25', directly below NC lead 25, is also an NC lead. An adhesive 62 or other joining material is preferably provided between the packages to facilitate stacking.

Referring to method step 130 in FIG. 2, and to the configuration of FIG. 4B, a direct solder connection 54 formed between NC lead 25 and CS lead 24. A similar direct solder connection is made between NC lead 43 and CKE lead 44, which connection is not visible in the left-side view shown in FIG. 4B.

As noted in method step 140 in FIG. 2, direct electrical connections are now made between selected leads on upper semiconductor package 50 to corresponding leads on lower semiconductor package 50'. As noted these connections are preferably solder connections, which may be made in a variety of ways, including use of a two hot-bar soldering system, a pulse head soldering, system, etc.

Referring to FIG. 5A, such direct electrical connections 66, 68 are made between selected leads of the upper semiconductor package 50 to corresponding leads of the lower, underlying, semiconductor package 50'. Shortened CS and CKE leads of package 50 are not selected for direct solder connections to the lower package 50'. As shown in the end-view of FIG. 5B, shortened CS lead 24 of upper package 50 is not connected to CS lead 24' of package 50', but NC lead 43 of upper package 50 is connected to NC lead 43' of lower package 50'.

After assembly of the structure shown in FIGS. 5A and 5B, the overall structure is preferably checked for open connections and for shorted connections, for example using a gross function tester. Lead co-planarity is preferably checked, for example with a DDC scanner, and visual inspection of the completed structure may be carried out under a microscope or the like.

It will be appreciated that the present invention provides a straightforward method for stacking two (or more than two) package units, without requiring a mirror-image orientation between adjacent units. Further, such connections within a unit, and connections from one unit to another unit are made without recourse to auxiliary structures, as are required by many prior art techniques.

Although exemplary embodiments have been described with reference to specific configurations, those skilled in the art will appreciate that various changes and modifications can be made, while remaining within the scope of the invention as defined by the following claims. For example, the preferred embodiments refer to making a direct solder connection between chip-select or clock-enable and not-connected leads of a semiconductor package unit. Those skilled in the art will realize that this process is advantageous for any lead of an upper semiconductor package unit that needs to be addressed independently of the corresponding lead of the lower semiconductor package unit.

What is claimed is:

1. A method for forming a stacked package of at least an upper semiconductor package unit and a lower semiconductor package unit, the method comprising:
   (a) flattening leads of said upper semiconductor package unit;
   (b) shortening at least one selected lead of said upper semiconductor package unit such that the shortened said lead does not contact a lead of said lower semiconductor package unit when said upper semiconductor package unit is stacked atop said lower semiconductor package unit in a same orientation;
   (c) stacking said upper semiconductor package unit on said lower semiconductor package unit in said same orientation:
   (d) forming a direct electrical connection between two leads of said upper semiconductor package unit; by soldering said two leads; and
   (e) forming direct electrical connections between leads of said upper semiconductor package unit and corresponding leads of said lower semiconductor package unit.

2. The method of claim 1, wherein said upper and lower semiconductor package units have identical lead layouts.

3. A method for forming a stacked package of at least an upper semiconductor package unit and a lower semiconductor package unit wherein said upper semiconductor package unit has a chip-select (CS) lead and a not-connected (NC) lead, the method comprising:
   (a) flattening leads of said upper semiconductor package unit;
   (b) shortening at least one selected lead of said upper semiconductor package unit such that the shortened said lead does not contact a lead of said lower semiconductor package unit when said upper semiconductor package unit is stacked atop said lower semiconductor package unit in a same orientation;
   (c) stacking said upper semiconductor package unit on said lower semiconductor package unit in said same orientation;
   (d) forming a direct electrical connection between said CS lead and said NC lead; by soldering said CS lead and said NC lead; and
   (e) forming direct electrical connections between leads of said upper semiconductor package unit and corresponding leads of said lower semiconductor package unit.

4. A method for forming a stacked package of at least an upper semiconductor package unit and a lower semiconductor package unit, wherein said upper semiconductor package unit has a clock-enable (CKE) lead and a not-connected (NC) lead, the method comprising:
   (a) flattening leads of said upper semiconductor package unit;
   (b) shortening at least one selected lead of said upper semiconductor package unit such that the shortened said lead does not contact a lead of said lower semiconductor package unit when said upper semiconductor package unit is stacked atop said lower semiconductor package unit in a same orientation;
   (c) stacking said upper semiconductor package unit on said lower semiconductor package unit in said same orientation;
   (d) forming a direct electrical connection between said CKE lead and said NC lead; and
   (e) forming direct electrical connections between leads of said upper semiconductor package unit and corresponding leads of said lower semiconductor package unit.

5. The method of claim 4, wherein step (d) includes forming said direct electrical connection by soldering said CKE lead and said NC lead.

6. A method for forming a stacked package of at least an upper semiconductor package unit and a lower semiconductor package unit, wherein said upper semiconductor package unit has a clock-enable (CKE) lead, the method comprising:
   (a) flattening leads of said upper semiconductor package unit;
   (b) shortening a length of said CKE lead such that the shortened said CKE lead does not contact a lead of said lower semiconductor package unit when said upper semiconductor package unit is stacked atop said lower semiconductor package unit in a same orientation;

(c) stacking said upper semiconductor package unit on said lower semiconductor package unit in said same orientation;

(d) forming a direct electrical connection between two leads of said upper semiconductor package unit; and (e) forming direct electrical connections between leads of said upper semiconductor package unit and corresponding leads of said lower semiconductor package unit.

7. A method for forming a stacked package of at least an upper semiconductor package unit and a lower semiconductor package unit, wherein said upper semiconductor package unit has a clock-enable (CKE) lead, the method comprising:

(a) flattening leads of said upper semiconductor package unit;

(b) shortening at least one selected lead of said upper semiconductor package unit such that the shortened said lead does not contact a lead of said lower semiconductor package unit when said upper semiconductor package unit is stacked atop said lower semiconductor package unit in a same orientation;

(c) stacking said upper semiconductor package unit on said lower semiconductor package unit in said same orientation;

(d) forming a direct electrical connection between two leads of said upper semiconductor package unit; and (e) forming direct electrical connections between leads of said upper semiconductor package unit and corresponding leads of said lower semiconductor package unit, excluding selecting said CKE lead.

8. A method for forming a stacked package of at least an upper semiconductor package unit and a lower semiconductor package unit, the method comprising:

(a) flattening leads of said upper semiconductor package unit;

(b) shortening at least one selected lead of said upper semiconductor package unit such that the shortened said lead does not contact a lead of said lower semiconductor package unit when said upper semiconductor package unit is stacked atop said lower semiconductor package unit in a same orientation;

(c) stacking said upper semiconductor package unit on said lower semiconductor package unit in said same orientation;

(d) forming a direct electrical solder connection between two adjacent leads of said upper semiconductor package unit; and (e) soldering a direct electrical connections between adjacent leads of said upper semiconductor package unit and corresponding leads of said lower semiconductor package unit.

* * * * *